(12) United States Patent
Berkcan et al.

(10) Patent No.: US 6,734,660 B1
(45) Date of Patent: May 11, 2004

(54) CURRENT SENSOR ARRANGEMENT WITH TEST CURRENT GENERATOR

(75) Inventors: Ertugrul Berkcan, Niskayuna, NY (US); Scott Baxter Hoyle, Maple Shade, NJ (US)

(73) Assignee: Lockheed Martin Corporation, Bethesda, MD (US)

( * ) Notice: Subject to any disclaimer, the term of this patent is extended or adjusted under 35 U.S.C. 154(b) by 144 days.

(21) Appl. No.: 10/072,033

(22) Filed: Feb. 7, 2002

(51) Int. Cl.[7] ................................................ G01R 33/02
(52) U.S. Cl. .................................... 324/117 R; 324/126
(58) Field of Search ........................ 324/117 R, 117 H, 324/127, 251, 252, 105, 126; 327/510–513

(56) References Cited

U.S. PATENT DOCUMENTS

| | | | | |
|---|---|---|---|---|
| 3,764,905 A | * | 10/1973 | Zappe | 324/102 |
| 4,639,665 A | * | 1/1987 | Gary | 324/117 H |
| 5,874,848 A | * | 2/1999 | Drafts et al. | 327/511 |
| 5,966,008 A | * | 10/1999 | Maier et al. | 324/96 |
| 6,150,809 A | * | 11/2000 | Tiernan et al. | 324/238 |
| 6,356,068 B1 | * | 3/2002 | Steiner et al. | 324/117 H |
| 6,384,600 B1 | * | 5/2002 | Coehoorn | 324/252 |
| 6,486,662 B1 | * | 11/2002 | Ruigrok et al. | 324/252 |

\* cited by examiner

*Primary Examiner*—Kamand Cuneo
*Assistant Examiner*—Russell M. Kobert
(74) *Attorney, Agent, or Firm*—Duane Morris LLP

(57) ABSTRACT

A current sensor arrangement for measuring electrical current flow (subject flow) includes an elongated conductor for carrying the subject flow through a region. A magnetic field sensing device is located in the region, and produces a sensed voltage representative of the magnitude of the magnetic field in the region. A test generator generates a magnetic field component having "known" magnitude in the spatial region. The test generator is gated, so that the magnetic field changes when the test generator is ON. If the test generator generates its magnetic field by passing a test current through the spatial region, the change in the magnetic field, which is expressed in the sensed voltage, is related to the test current. Simple control circuit processing determines the subject current from the sensed magnetic field and the known magnitude of the test current.

5 Claims, 8 Drawing Sheets

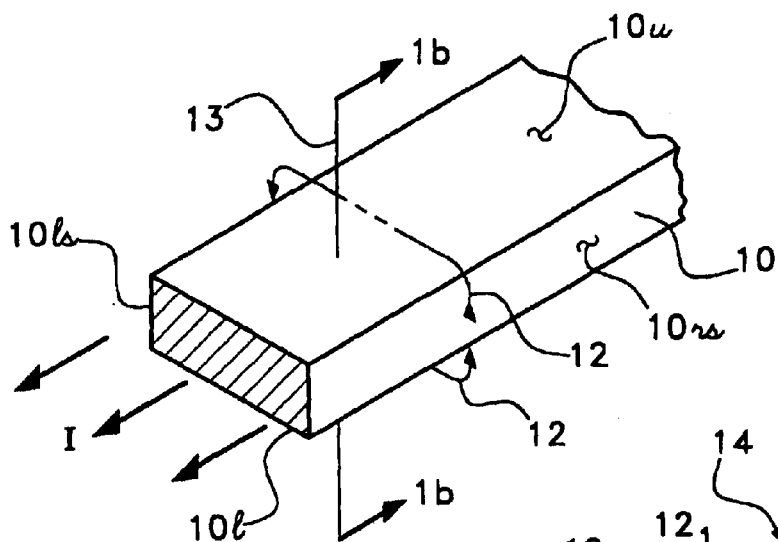
Fig. 1a
Fig. 1b
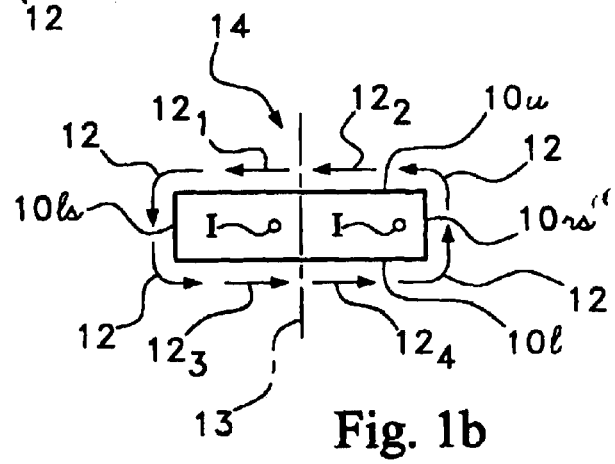
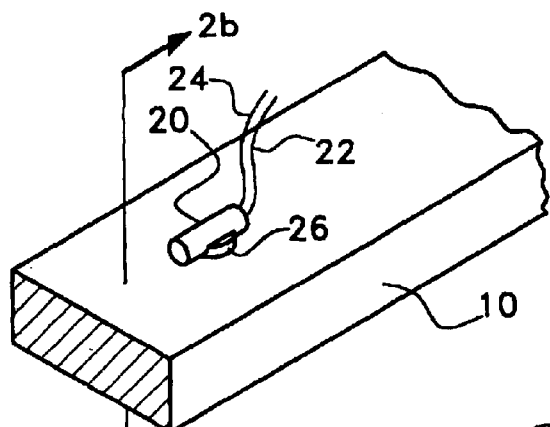
Fig. 2a
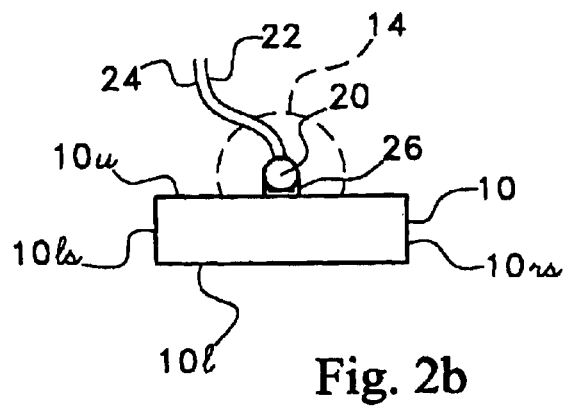
Fig. 2b

CURRENT SENSOR ARRANGEMENT WITH TEST CURRENT GENERATOR

FIELD OF THE INVENTION

This invention relates to current sensor arrangements, and more particularly to current sensor arrangements which use magnetic sensing devices which may be, or are, subject to unit-to-unit variation as a result of manufacturing tolerances, andor which, once manufactured, may be subject to errors or deviations as a result of temperature variations, aging, and the like.

BACKGROUND OF THE INVENTION

Seagoing vessels, regardless of whether they are intended for sport, commerce, or warfare, share in common the need to maintain their buoyancy and control in the face of potentially violent conditions including storms, grounding, andor hostile action. Maintaining control and buoyancy in the face of damage due to such violent conditions may require rapid amelioration of, or adaptation to, such damage. In a large ship, there may be many compartments, the entrances to which are separated by a sufficient distance from each other so that considerable time may be required for movement from one compartment to another. The existence of such compartments has in the past given rise to the need for an observer assigned to each compartment or set of compartments to monitor conditions. It might be thought that speaker tubes or telephones would be suitable for communicating between each of the various compartments and a control center or bridge, but there is a real possibility that damage to a compartment might also damage the communications equipment. Consequently, warships assign crew members to be messengers, whose duty is to carry information from the compartments to the control center or bridge in the event of a break in the communications. Damage to one compartment of a ship may require adjustments in many compartments, as for example when flooding of a compartment requires redistribution of the ship's load or supplies to prevent excessive list. The adjustments may include operation of valves and switches within the compartments, as might be required, for example, to start pumps and open valves for the dumping overboard of bilge water, or for redistributing liquid fuel from tanks on one side of the ship to tanks on the other side. Because time is very important when attempting to cope with damage, warships have in the past stationed crews at various locations about the ship. These crews are charged with the duties of operating valves and switches as commanded or trained. In addition to such adjustments, additional crews must be provided to be on standby for firefighting, for damage repair, and for tending the injured. In the case of a warship, a portion of the crew must additionally be used for manning weapons and countermeasure. Since the tending of injured presupposes that some of the crew is not capable of performing its duties, the crew must, even when reduced in number by casualties, be large enough to be able to perform all of the tasks associated with tending a ship in distress. All of these considerations result in the manning of ships with crews large enough to provide "surge" capability for the handling of any emergency. A large battleship of WWII vintage had a crew in excess of 3000 men, and an aircraft carrier in the vicinity of 5000. Even modern missile destroyers require crews exceeding 300 persons.

The presence of such large crews inevitably has its effects on ship design. It will be clear that the housekeeping and support requirements tend to expand disproportionally as the crew grows larger. The ship itself must be large in order to hold the oversize crew, and must carry additional stores such as food, which makes it larger still. Food preparation areas must be larger with a large crew, and the additional food preparation personnel in turn require their own support staff and ship facilities. The cost of ships is adversely affected by the need for a crew of a size to provide surge capability, and the cost of operating such ships is directly increased by the supernumerary members of the crew. The operating cost is further increased by the need to maintain the supernumerary members. It is thus of great importance in ship design to take into account the staffing requirements of the ship, and to improve ship design in such a manner as to minimize the crew size.

The Navy has recognized the disadvantages of such large crews, and is examining ways in which automation might reduce crew sizes. In some proposed systems, automation controls valves, electrical motors, and the like by way of a reliable local area network. "Smart" controls coupled to the local area network monitor the status of the various components of the ship, make relatively autonomous decisions as to the actions to be taken in response to various sensed conditions in view of the state of ship readiness which an operator sets, and implements the decisions by operating various valves and equipments. Many of the equipments are electrically operated, such as ship drive, gun slewing mechanisms, weapon hatches, fuel pumps, and other motor-driven devices. It is desirable to monitor the electrical load current of such motor-driven devices to aid in determining the state of the device itself, and also to determine that the commands are being carried out. Load current may be monitored by means of electrical current sensors.

Improved current sensors are desired.

SUMMARY OF THE INVENTION

A current sensor arrangement for measuring a subject electrical current flow includes an elongated conductor having fixed dimensions, which is to stay invariant with time. The elongated conductor is configured for producing a generally planar magnetic field within a spatial region adjacent the conductor when the subject electrical current flows through the elongated conductor. A magnetic field sensing or measuring device is located in the spatial region with a particular direction generally parallel to the planar magnetic field. The magnetic field sensing device produces a signal voltage in response to a magnetic field in the particular direction therethrough, and the magnitude of the signal voltage is approximately linearly related to the magnitude of the magnetic field in its vicinity, at least over a limited range of magnetic fields. The magnetic field sensing device may be either temperature-dependent, variable in its sensitivity from device to device, or both, or neither. The magnetic field sensing device produces a magnetic-field-representative signal voltage in response to the magnetic field. The current sensor arrangement also includes a controllable test or bias current generator magnetically coupled to the spatial region, for, when energized, generating a test current flow, which may be a predetermined current flow, for generating a test or bias magnetic field component in the spatial region. The test magnetic field component is desirably generally parallel with the planar magnetic field, whereby, or as a result of which, the magnetic field sensing device produces a magnetic-field-representative signal voltage related to the magnitude of the sum of the subject electric current with the test current. A control arrangement is coupled to the magnetic field sensing device and to the test current generating means, for recurrently energizing the controllable test current generating means, and for determining the magnitude of the current flow in the elongated conductor from at least (a) the magnitude of the magnetic-field-representative signal voltage during those times during which the controllable test current generating means is energized, (b) the magnitude of the magnetic-field-representative signal voltage during times in which the controllable test current generating means is not energized, and (c) the magnitude of the test current.

In a particular manifestation of the invention, the recurrent energization is periodic. Among the magnetic field sensing devices for which the invention is usable are giant magnetoresistive device and spin-dependent tunneling devices. In one distinct version of the invention, the test current generator is galvanically coupled to the elongated conductor adjacent the spatial region, for causing the test current to flow through the elongated conductor and thereby generate the test magnetic field within the spatial region. In this distinct version, the control arrangement comprises a switching arrangement, for, when in the conducting state, gating the predetermined current to the elongated conductor, and for, when in the nonconducting state, preventing the predetermined current from flowing in the elongated conductor. The galvanic connections may be made by current conductors connected to the elongated conductor on either side of the spatial region.

In another distinct version of the current sensor arrangement according to the invention, the controllable test current generator comprises a second electrical conductor extending through the spatial region, electrically isolated from the elongated conductor, and preferably parallel therewith. In this other distinct version, the control arrangement includes a switching arrangement, for, when in the conducting state, gating the test or predetermined current to the second electrical conductor, and for, when in the nonconducting state, preventing the test or predetermined current from flowing in the second electrical conductor.

BRIEF DESCRIPTION OF THE INVENTION

FIG. 1a is a simplified perspective or isometric view of a portion of an elongated electrical conductor through which a current to be measured flows, showing the magnetic field structure, and FIG. 1b is a cross-sectional view of the conductor looking in direction 1b—1b, showing that the magnetic field is roughly planar in a region around the conductor;

FIG. 2a is a simplified perspective or isometric view of a portion of a current sensor arrangement according to an aspect of the invention, which includes a portion of the conductor of FIG. 1a, and FIG. 2b is a cross-sectional view thereof looking in direction 2b—2b;

DESCRIPTION OF THE INVENTION

Figure 3:
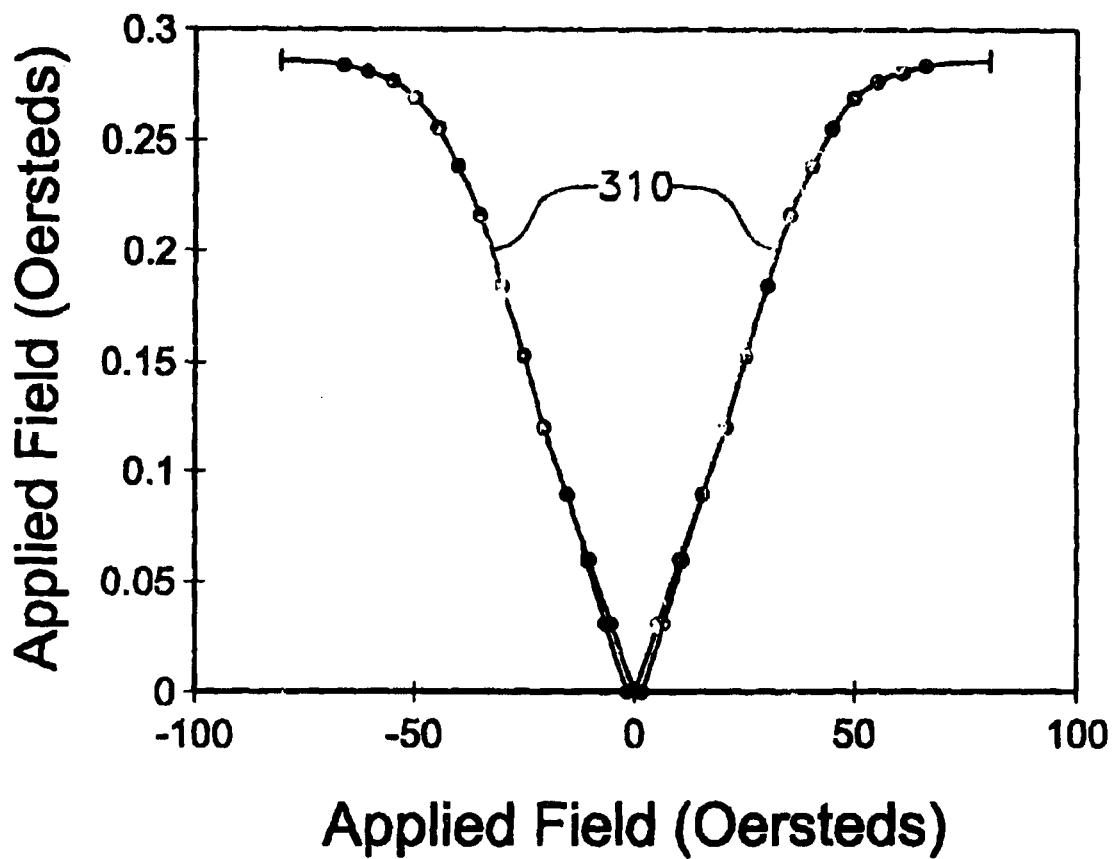
FIG. 3 is a plot of average voltage/magnetic field performance of a Giant Magneto Resistive device.

A portion of an elongated conductor 10 is illustrated. Conductor 10 is not circular, but is instead generally flattened to define a pair of mutually parallel broad surfaces 10u, 10l and a pair of mutually parallel narrow surfaces 10ls and 10rs. Conductors so shaped are commonly the result of fabrication of printed circuit traces. The conductor carries an unknown or subject current I which is to be measured. Current I of FIG. 1a causes a magnetic field illustrated by field lines designated 12. A theoretical bisector designated 13 extends through the broad surfaces, roughly orthogonal to those broad surfaces. Reference to FIG. 1b allows the general configuration of the magnetic field lines to be visualized as including a generally "flat" or planar portion or region 14 near the bisector 13. More particularly, field lines $12_1, 12_2, 12_3$, and $12_4$ can be seen to be substantially straight and mutually parallel, thereby defining two planes extending back into the FIG. Thus, flow of the unknown or subject current to be measured results in a (actually two) generally planar magnetic field components near the bisector of the conductor.

FIG. 2a illustrates elongated conductor 10 associated with a magnetic field sensing or measuring device 20, which can be held in place by any desired means, such as adhesive 26. Magnetic field sensing device 20 senses magnetic fields roughly within planar-magnetic-field spatial region 14, the general location of which is suggested by the region enclosed by the dash lines 14 in FIG. 2b. The magnetic field sensing device 20 is illustrated as a featureless cylinder, as its shape is irrelevant. Magnetic field sensing device 20 may be of any one of a number of types, including Giant Magneto-Resistive (GMR) devices or Spin Dependent Tunneling (SDT) devices. These devices are relatively small, and lend themselves to packaging in integrated-circuit chip carriers. Thus, the shape of the carrier is not particularly relevant to the operation.

It should be noted that at least some of the magnetic field sensing devices 20 which may be used in current sensor arrangements according to some aspects of the invention are preferentially sensitive to magnetic fields flowing in a particular direction therethrough. The different types are variously known as "perpendicular" or "orthogonal" in which the maximum sensitivity is to magnetic field lines transverse to the plane of the device, and "lateral" in which maximum sensitivity is to magnetic fields lying parallel to the plane of the device. This need not concern us, since the magnetic field sensing device 20 of FIGS. 2a and 2b can always be mounted in an orientation relative to the magnetic field in the planar region 14 which maximizes its sensitivity, depending upon its characteristics. The magnetic field sensing device 20 may require energization, which can be provided from an external source by wires, one of which is illustrated as 22.

In any case, the magnetic field sensing device 20 produces a sensed voltage which, within a linear range, is roughly proportional to the magnetic field in its vicinity. This voltage can be take from the magnetic field sensing device 20 by means of wires, one of which is illustrated as 24, for use by a utilization device.

FIG. 3 illustrates a plot 310 illustrating typical output voltage versus magnetic field strength for a Giant Magneto-Resistive device. It will be noted that the plot is quite straight in the region ranging from zero field to about 25 Oersteds. If this portion of the plot is used to make measurements, there is a substantial correspondence or correlation between the sensed voltage and the magnetic field in the vicinity 14 of the magnetic sensing device 20 of FIG. 2b. Unfortunately, the GMR sensors vary substantially from unit to unit, so the voltage reading produced by a randomly selected GMR cannot be relied upon to provide an accurate indication of magnetic field strength. Even if the GMR is selected to have response close to that of plot 310, it will be found that the response varies as a function of GMR temperature, so that even selection of the GMR cannot provide a reliably accurate indication of the magnetic field in the vicinity of the magnetic sensing device, and therefore also cannot provide a reliably accurate indication of the current in conductor 10 of FIGS. 2a and 2b. A selection process is expensive, and would result in a costly current sensor arrangement. Very costly sensors would militate against their widespread use in a shipboard environment (or in any other environment, for that matter), which would tend to limit their usefulness in replacing human observations or readings, contrary to the desired reduction in ship crew requirements.

According to an aspect of the invention, each current sensor arrangement is "continually" or recurrently normalized, compensated, or tested, so that its sensitivity is known at, or near, the moment in time at which the measurement is made. In short, this is accomplished by generating a "known" test or bias magnetic field component within the spatial region in which the magnetic sensing device lies, and processing the resulting information together with information obtained during non-test times, to determine the magnitude of the subject current flowing through the elongated conductor. More particularly, as illustrated by the current sensor arrangement 400 in the simplified schematic diagram of FIG. 4a, a test or bias current generating circuit designated generally as 410 includes a "current" source designated generally as 412, which includes a voltage source illustrated as a battery 414 and two resistors, namely resistors 416 and 418. Those skilled in the art know that a voltage source produces voltage and, when connected in a circuit, also produces current. In order to isolate the voltage source 414 from the conductor 10, the connections of voltage source 414 to conductor 10 are made by way of resistors 416 and 418. More particularly, resistor 416 connects the negative terminal of voltage source 414 to conductor 10 "downstream" (relative to the direction of current flow in conductor 10) from planar-magnetic-field region 14, and resistor 418 connects the positive terminal of voltage source 414 to conductor 10 "upstream" from region 14. In the particular circuit illustrated in FIG. 4a, voltage source 414 cannot be connected directly to the conductor 10 without some resistance in the circuit, because large currents would be likely to flow in the resulting circuit, possibly damaging the conductor 10, the voltage source 414, or at least potentially increasing the magnetic field within region 14 to a point at which the magnetic sensing device 10 becomes nonlinear. Thus, in the circuit of FIG. 4a, the resistors 416 and 418 serve dual functions, namely isolation of the voltage source from the circuit to which conductor 10 is connected, and also converting the voltage source 414 into a current source designated as 412. In operation of the circuit of FIG. 4a, the test current $I_{test}$ flows around the circuit including voltage source 414, resistor 418, conductor 10 in region 14, and resistor 416. The subject current $I_{subject}$ to be measured flows through conductor 10 as a result of a source circuit (not illustrated). In region 14 in which sensor 20 interacts with the planar magnetic field, the subject current $I_{subject}$ and the test current $I_{test}$ either add or subtract, depending upon their relative polarities. With the current directions indicated by the arrows in FIG. 4, the currents add. Thus, the current generating the magnetic field within region 14 is the vector sum (the "sum") of the subject current and the test current.

Figure 4A:
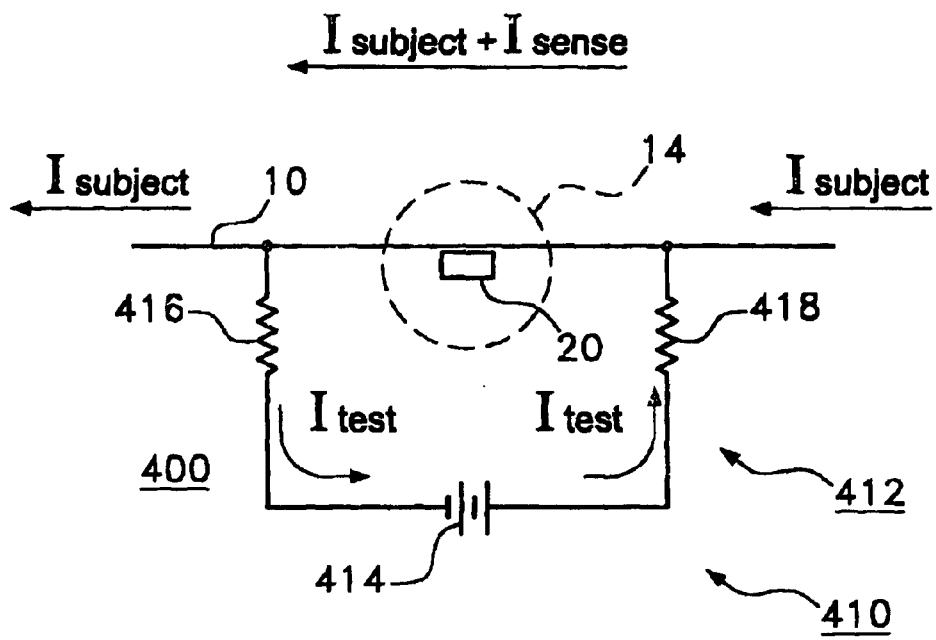
FIG. 4a is a simplified schematic diagram of a magnetic field sensing or measuring device associated with a subject-current carrying conductor and a test current generator which causes test current to flow in the same conductor with the subject current.
Figure 4B:
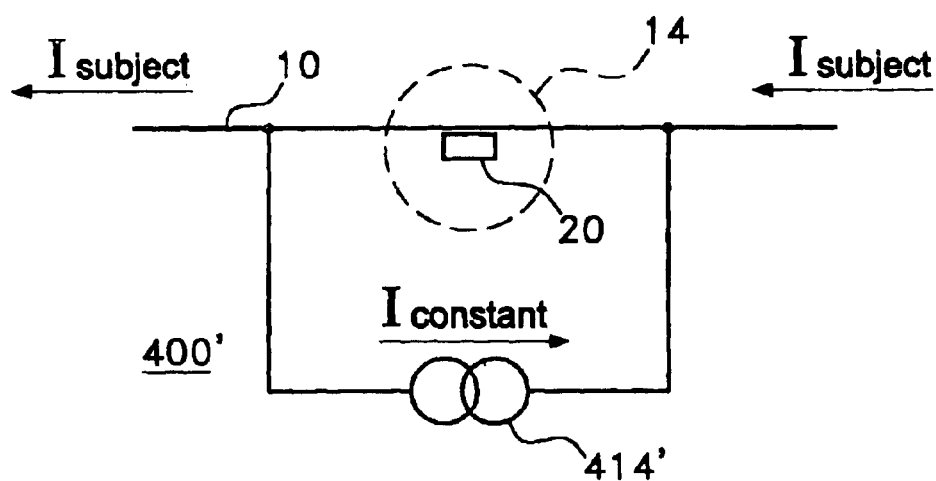
FIG. 4b illustrates a variant thereof.

The term "current source" sometimes connotes an electrical source having a high impedance, so that variations in the load do not affect the current. Such a use of the term "current source" makes it equivalent to the term "constant-current source." Such circuits exist and use feedback principles to tend to maintain a given value of current, and in principle such a source will produce any voltage which may be required in order to make the design current flow. In actual practice, of course, these circuits have limits on the amount of voltage which can be generated, and so in the limit the constancy of the current fails. FIG. 4b illustrates a current-sensing arrangement 400' including a circuit similar to that of FIG. 4a, in which a constant-current source 414' is connected as a test current source. Constant-current source 414' of FIG. 4a has its terminals connected to conductor 10 on either side (meaning on both sides) of region 14, as was the case in FIG. 4a. The difference between FIGS. 4a and 4b lies in the fact that the test current source in FIG. 4b is a "current" source having, in principle, a high internal impedance. The high impedance prevents any voltage which may occur across its terminals from affecting the constancy of the current. Thus, it would appear to be superior to the arrangement of FIG. 4a. However, the apparent simplicity of the arrangement of FIG. 4b may not be realized in practice, since the constant-current source 414' is actually itself a circuit, which has components which must be protected from harmful surges and noise. Thus, in practice the arrangement of FIG. 4 may require resistors similar to those of FIG. 4a simply for protection of the constant-current source, or alternatively to provide a convenient test location for determining the existence of current flow. Regardless of whether a voltage source with resistors or a high-impedance constant-current source is used, the magnitude of the test current will be known. In the case of a voltage source with resistors, the current I will be equal to the voltage E divided by resistance R, so that I=E/R as known in the art, and in the case of a high-impedance current source the test current will be the design current.

According to a further hypostasis of the invention, a gating or control arrangement is provided, which gates the test current source 410 on a recurrent basis, which is to say from time to time. The recurrence may be periodic or nonperiodic, but periodic systems are well known and simple to make, and so may be preferred. The test current is recurrently gated ON and OFF. As a result, the test current will be summed with the subject or unknown current flowing in conductor 10 to produce a magnetic field in region 14 which includes components attributable to the subject current and the test current. As the test current is gated ON and OFF, the net current producing the relevant magnetic field will change by an amount representative of the test current. If the test current sums with the subject current additively, as illustrated in FIGS. 4a and 4b, the magnetic field experienced by magnetic sensing device 20 will increase during those intervals in which the test current source is ON.

Figure 5A:
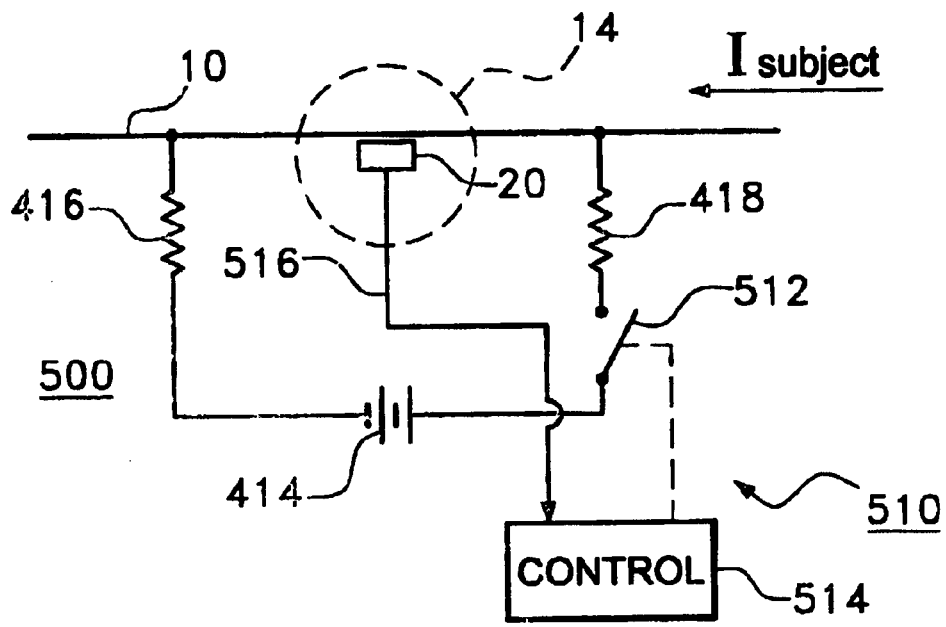
FIG. 5a is a simplified diagram in block and schematic form of a current sensor arrangement according to an aspect of the invention, illustrating one method for switching a test circuit generator ON and OFF.

FIG. 5a is a simplified diagram in block and schematic form illustrating another avatar of the invention. In FIG. 5a, elements corresponding to those of FIG. 4a are designated by like reference numerals. In FIG. 5a, the current sensor arrangement 500 includes a source 510, which includes voltage source 414 and resistors 416 and 418. In addition, test current source 510 includes a switch 512 illustrated as a mechanical switch in accordance with conventions of the art. There are other conventions which might be used, but the one selected is suitable for explanatory purposes. Those skilled in the art know that mechanical switches or relays are seldom used, as solid-state devices are often sufficient. Switch 512 is connected in-circuit with the test current source, so that the test current path is broken when the switch 512 is open or non-conductive. When the test current path is opened or broken, the test current ceases.

Switch 512 of current sensor arrangement 500 of FIG. 5a is controlled, according to this other aspect of the invention, by a control circuit 514, which also receives sensed voltage from magnetic sensing device 20 by way of a path illustrated as a conductor 516. It is advantageous for control circuit 514 to control switch 512, because the fact of control provides control circuit 514 with some of the information it needs in order to determine the subject current, namely the times when the test current is ON and those in which it is OFF. In the absence of control of switch 512 by control circuit 514, the switch 512 would have to be controlled by some other entity. In that case, control circuit 514 could communicate with the control entity or with the switch itself to determine the switch state, or the control circuit could attempt fancy processing akin to correlation to attempt to determine the test and non-test intervals. However, assuming that control circuit 514 "knows" the state of switch 512 and the magnitude of the test current, it is in a position to determine the magnitude of the subject current.

Figure 5B:
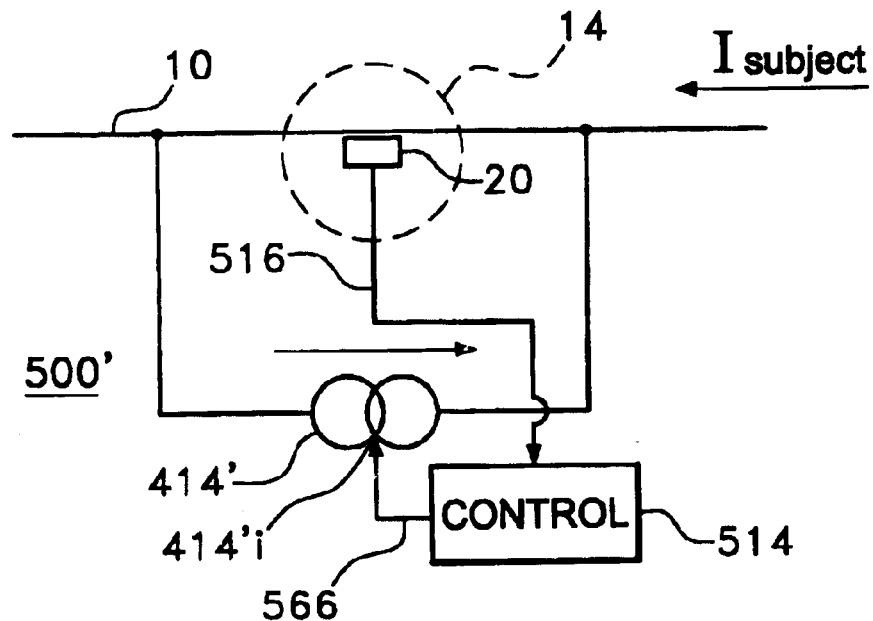
FIG. 5b illustrates an alternative version thereof.

FIG. 5b illustrates as an alternative embodiment a current sensor arrangement 500', in which a high-impedance test current source is controlled, over a path 566, by a control circuit 514'. Since, in principle, the current source will produce any voltage, however high, in order to cause the current to flow, it is not possible to open the test current circuit by means of a switch as in FIG. 5a. Instead, the high-impedance constant-current source 414' is recurrently gated ON and OFF by a control signal applied to a gating input port 414'i.

Figure 6A:
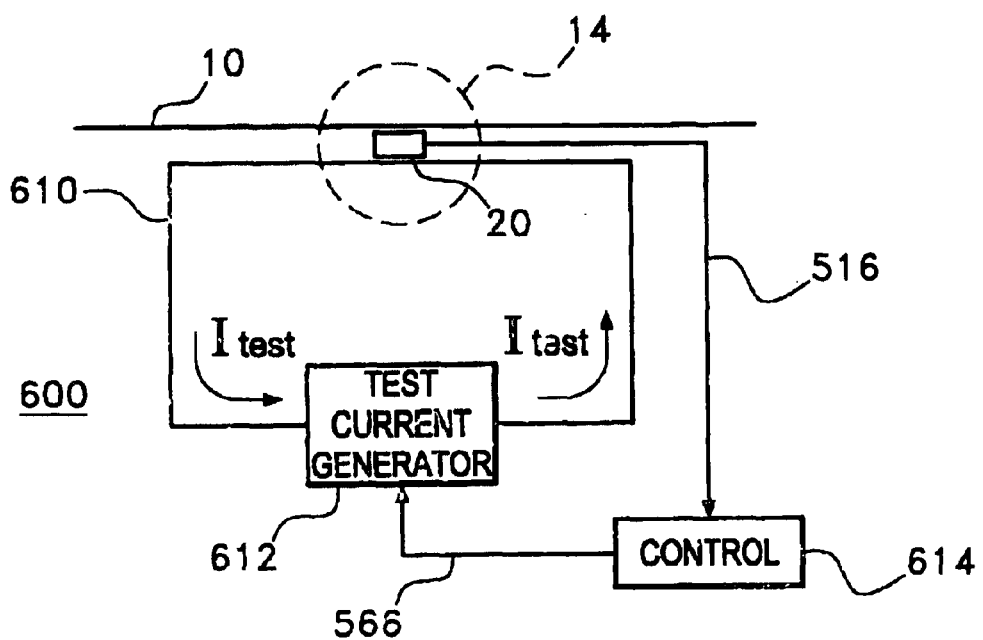
FIG. 6a is a simplified diagram in block and schematic form of a current sensor arrangement according to another aspect of the invention, in which the test current flows through a second path, independent of the path in which the current being measured flows.

FIG. 6a illustrates a scheme for generating the test magnetic field component in region 14 by passing the test current $I_{test}$ from a test current generator 612 through a conductor 610 which parallels conductor 10 in region 14. Conductor 610 is electrically or galvanically isolated from conductor 10. Such an arrangement is desirable for aiding in maintaining a relatively low-energy test circuit from a conductor 10 subject to high energy, in order to aid in protecting the components of the test current generator 612. So long as the configuration of the test current conductor generates the desired magnetic field in the vicinity of magnetic sensing device 20, there should be no difference in the magnetic sensing device performance relative to the arrangements of FIGS. 2a, 2b, 4a, 4b, 5a, and 5b.

Figure 6B:
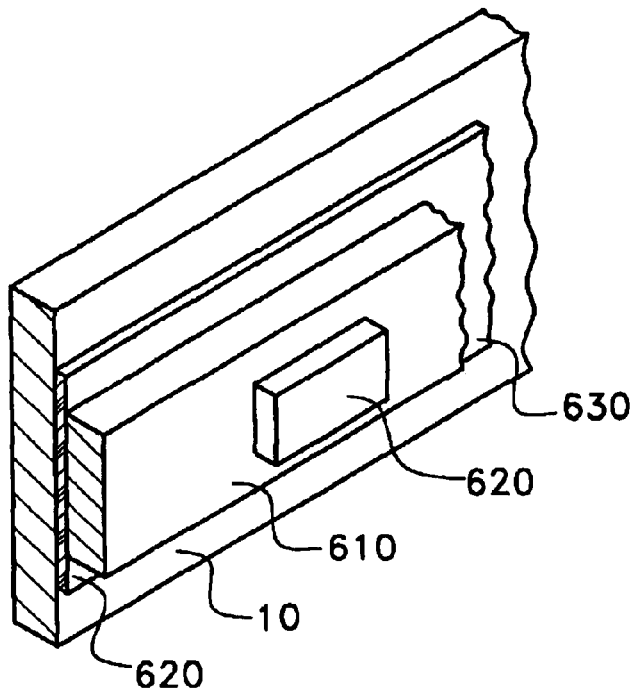
FIG. 6b illustrates an alternative version thereof.

FIG. 6b illustrates one physical configuration of the juxtaposed conductors which should be satisfactory. In FIG. 6b, both conductors 10 and 610 have the same generally flat configuration, and they lie adjacent each other with their flat sides juxtaposed, separated only by a sheet 630 of dielectric insulation. In FIG. 6b, the magnetic sensing device is illustrated as a flat rectangle 620, having its plane parallel to that of the generally planar conductors 10 and 610. However, if the magnetic sensing device 620 is sufficiently small relative to the other structures, the terms "lateral" and "orthogonal" become less important, as the sensor can simply be repositioned to sense the magnetic field.

Figure 7A:
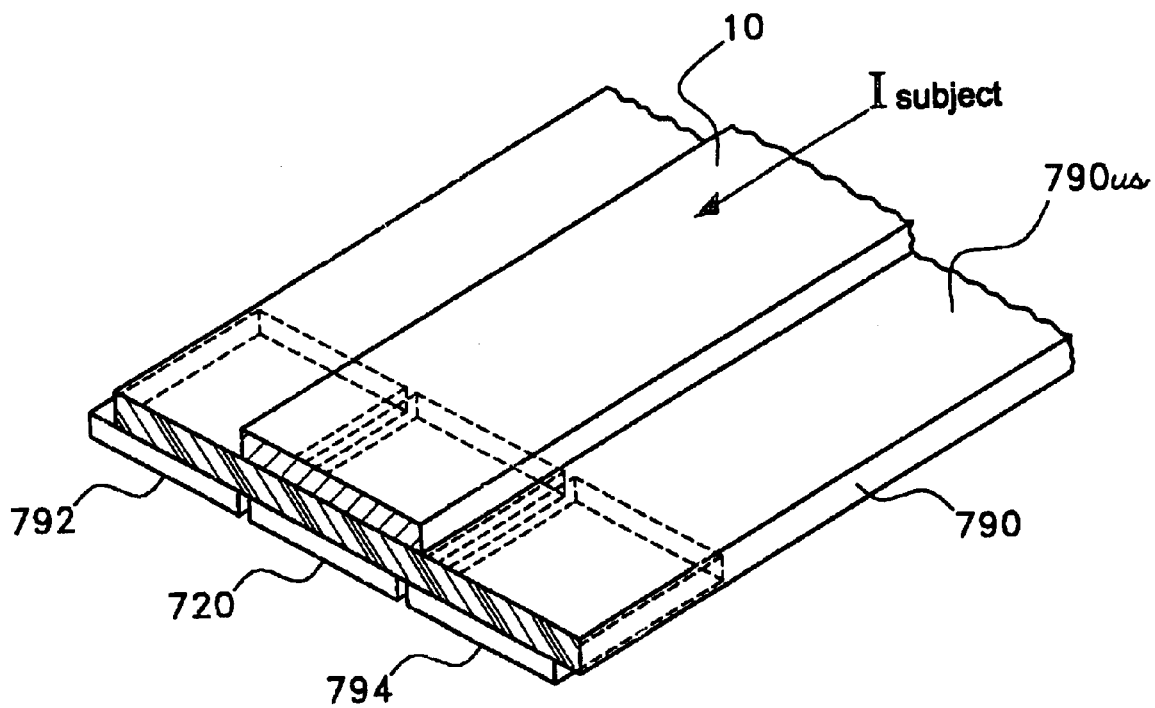
FIGS. 7a and 7b are simplified perspective and cross-sectional views of a current sensor arrangement according to an aspect of the invention which is arranged for printed-circuit type fabrication, and which uses field concentrators.
Figure 7B:
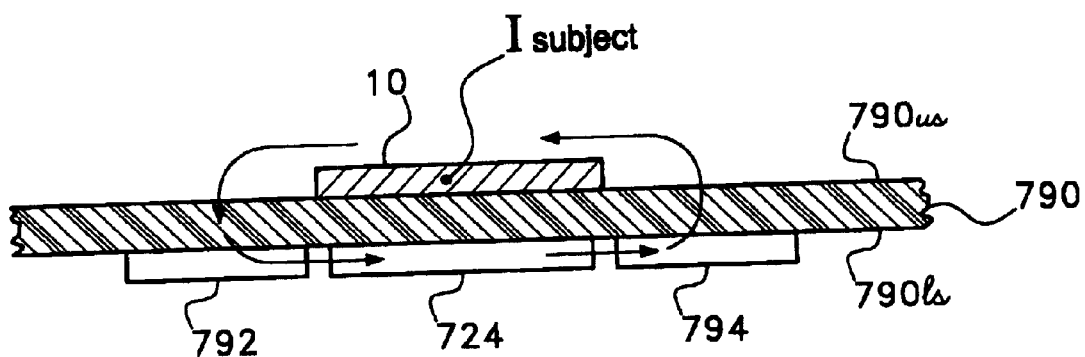

FIG. 7a is a simplified perspective or isometric view of a printed-circuit board embodiment of an aspect of the invention, which uses flux concentrators in the region of the magnetic sensing device, and FIG. 7b is a cross-section thereof in the region of the magnetic sensing device. In FIG. 7a and 7b, $I_{subject}$ flows in elongated flat or planar conductor 10, which lies on the upper surface 790us of a dielectric slab or plate 790. The integrated-circuit magnetic sensing device is designated as 720, and lies against the lower surface 790ls of the dielectric plate 790. In this embodiment, the magnetic sensing device is a lateral device, subject to the proviso that if it is small, the type is essentially irrelevant. A pair of generally flat magnetically permeable flux concentrator plates 792, 794 lie against the lower surface 790ls of the dielectric plate, with their planes aligned with the plane of the magnetic sensing device 720. The flux concentrator plates may be viewed as "scavenging" magnetic field lines which would tend to bypass the magnetic sensing device 720, or flowing through the sensor element at an undesirable angle, and causing those field lines to tend to pass through the sensor parallel with the plane of the sensor, thereby tending to increase the sensitivity of the sensor in the application.

Printed-circuit embodiments of the invention are very desirable, because the physical structure of the conductor 10 and test current conductors, if used, and their locations relative to each other and to the magnetic sensing device, can be controlled. Thus, experimentation can be used to determine the optimum locations of the various elements, so as to obtain the desired ratio of test flux to subject flux at the magnetic sensing device.

Figure 8:
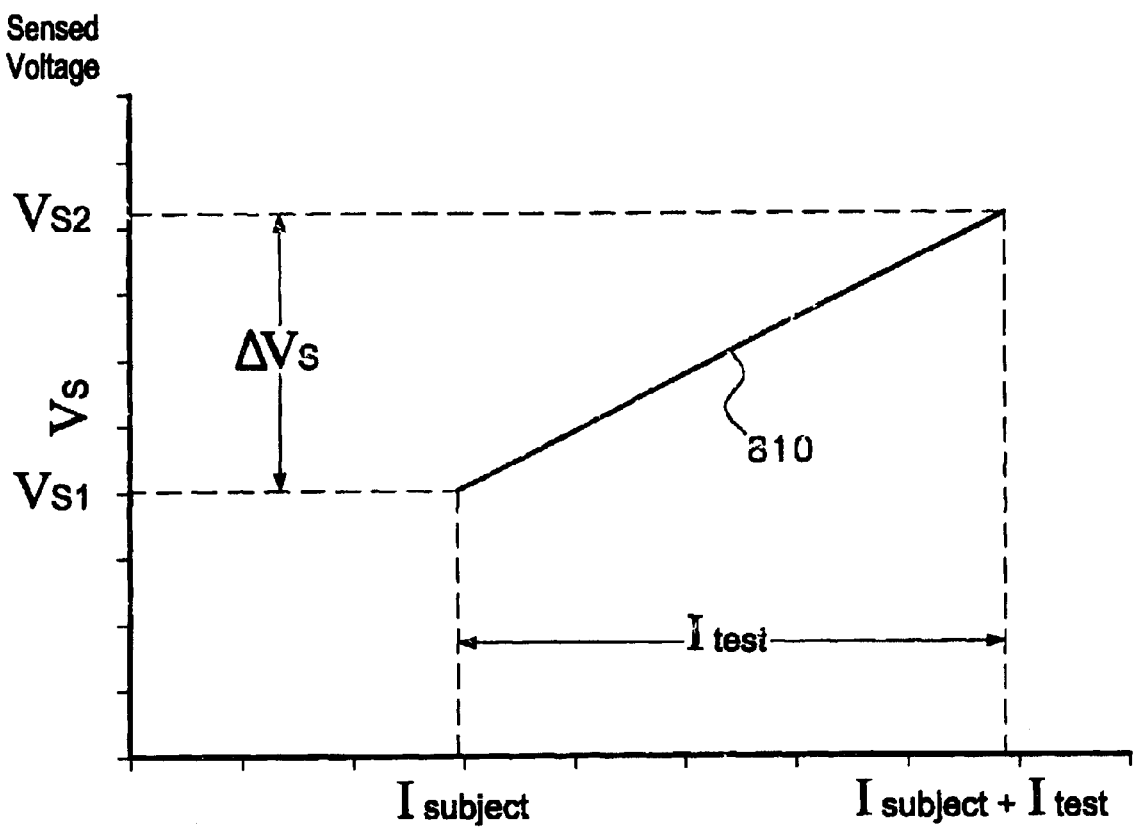
FIG. 8 is a diagram of sensed output voltage versus the sum of the currents in the spatial region of a GMR magnetic field sensor.

FIG. 8 illustrates the relationship of the sensed voltage of a magnetic sensing device relative to the sum of the subject current and the test current for a particular physical layout. In FIG. 8, the voltage $V_{s1}$ results from a magnetic field resulting from an arbitrarily selected value of $I_{subject}$. For various values of $I_{test}$ which cause a magnetic field component which sums with the magnetic field component caused by the subject current, the total sensed voltage rises along a line designated 810. Thus, at a test or bias current having a magnitude designated $I_{test}$ in FIG. 8 results in a sensed output voltage from the magnetic sensing device which is near $V_{s2}$, which represents an increase of $\Delta V_s$ from the base value of $V_{s1}$. The sensitivity S of the magnetic field sensor device can then be expressed as:

$$S = \frac{V_{s2} - V_{s1}}{I_{subject} + I_{test} - I_{subject}} = \frac{\Delta V}{I_{test}} \qquad 1$$

under all conditions of external and internal environment and noise.

In an embodiment of the invention for use in measuring alternating currents, the unipolar characteristic of some of the magnetic field sensor elements which can be used allows elimination of the absolute-value circuits which would otherwise be required. Those current sensor arrangements according to the various aspects of the invention which are made with printed-circuit or other bulk processing methods, a opposed to individual assembly/alignment of various elements, may provide both a cost advantage and the ability to maintain the dimensions of the various conductors, spacings, and magnetic relationships so that a very consistent current sensor arrangement can be fabricated from unit to unit. The processing of the data according to certain aspects of the invention allows use of devices which are inconsistent in performance from unit to unit and under various temperature or other conditions.

Figure 9:
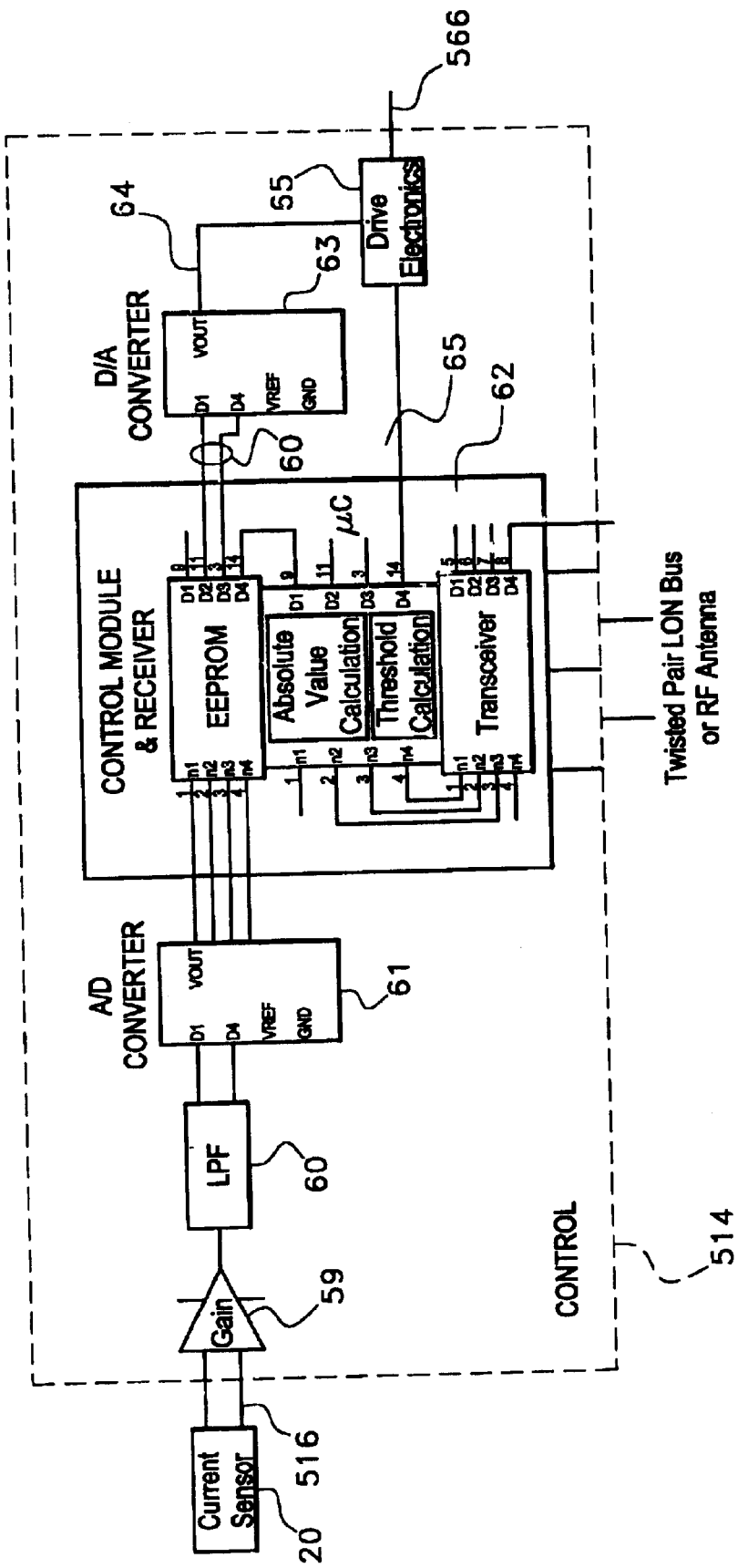
FIG. 9 is a simplified diagram in block and schematic form of a controller according to an aspect of the invention.

FIG. 9 is a simplified diagram in block and schematic form, illustrating some details of a controller 514 of FIG. 5a, 5b, or 6. In FIG. 9, the magnetic-field-representative voltage produced by sensor 20 is applied by way of conductor set 516 to an amplifier or gain element 59 of control 514. The amplified signal is filtered in a filter 60 for noise reduction and applied to an analog-to-digital converter (ADC) 61 for conversion into digital form. The digital signals representing the magnetic field are applied to microprocessor ($\mu C$) 65 including absolute-value and threshold calculations illustrated as 62. The microprocessor also includes information stored in memory, such as an EEPROM, which define the test current to be generated. The test current defining digital signals are applied by way of a path 68 to a digital-to-analog converter (DAC) 63 which generates an analog signal representing the test or calibration current. The analog signal is applied from DAC 63 to drive electronics, illustrated as a block 65, which generates the test current directly or which produces a control signal on conductor 566 for application to current source 414 of FIG. 5b or test current generator 612 of FIG. 6a.

Other embodiments of the invention will be apparent to those skilled in the art. For example, while the orientation of the plane and directions of maximum sensitivity of the magnetic field sensing device have been described as being preferably coincident with the plane and orientation in the plane of the magnetic field in the spatial region, this is only necessary if maximum sensitivity to the fields is desired; other orientations are possible, and may be advantageous when the magnetic fields are strong. Also, the test current excitation periods are easily controlled b the microprocessor.

Thus, a current sensor arrangement (500, 500') for measuring a subject electrical current flow ($I_{subject}$) includes an elongated conductor (10) having fixed dimensions, which is to say dimensions which are invariant with time. The elongated conductor (10) is configured for producing a generally planar magnetic field within a spatial region (14) adjacent the elongated conductor (10) when the subject electrical current ($I_{subject}$) flows through the elongated conductor (10). A magnetic field sensing device (20) is located in the spatial region (14) with a preferred or particular direction or orientation generally parallel to the planar magnetic field. The magnetic field sensing device (20) produces a signal voltage (310) in response to a magnetic field in the particular direction therethrough, and the magnitude of the signal voltage (310) is approximately linearly related to the magnitude of the magnetic field in its vicinity, at least over a limited range of magnetic fields. The magnetic field sensing device (20) may be either temperature-dependent, variable in its sensitivity from device to device, or both, or neither. The magnetic field sensing device (20) produces a magnetic-field-representative signal voltage (310) in response to the magnetic field. The current sensor arrangement (500, 500') also includes a controllable test generator magnetically coupled to the spatial region (14), for, when energized, generating a predetermined magnetic field component in the region (14). In some embodiments of the invention, the test generator is a current generator (410) which generates a predetermined current flow near or in the region (14) for generating a test magnetic field component in the spatial region (14). The test magnetic field component should be generally parallel with the planar magnetic field for maximum sensor sensitivity to the test component, whereby, or as a result of which, the magnetic field sensing device (20) produces a magnetic-field-representative signal voltage (350) related to the magnitude of the sum of the subject electric current ($I_{subject}$) with the predetermined current ($I_{sense}$). A control arrangement (514) is coupled to the magnetic field sensing device (20) and to the test generating means, for recurrently energizing (by way of switch 512 or gating port 414'i) the controllable test generating means, and for determining the magnitude of the subject current flow ($I_{subject}$) in the elongated conductor (10) from at least (a) the magnitude of the magnetic-field-representative signal voltage during those times during which the controllable test generating means is energized, (b) the magnitude of the magnetic-field-representative signal voltage during times in which the controllable test current generating means is not energized, and (c) the magnitude of the predetermined current.

In a particular manifestation of the invention, the recurrent energization is periodic. Among the magnetic field sensing devices (20) for which the invention is usable are giant magnetoresistive devices and spin-dependent tunneling devices. In one distinct version (400, 400', 500, 500') of the invention, the test generator is a test current generator (412) which is galvanically coupled to the elongated conductor (10) adjacent the spatial region (14), for causing the test current ($I_{test}$) to flow through the elongated conductor (10) and thereby generate the test magnetic field component within the spatial region (14). In this distinct version, the control arrangement (514) comprises a switching arrangement (512 or gating signal), for, when in the conducting state, gating the predetermined test current to the elongated conductor (10), and for, when in the nonconducting state, preventing the predetermined current from flowing in the elongated conductor (10). The galvanic connections may be made by current conductors connected to the elongated conductor (10) on either side of the spatial region (14), and the current conductors may include resistors or resistance arrangements (416, 418).

In another distinct version of the current sensor arrangement (600) according to the invention, the controllable test current generator comprises a second electrical conductor (610) extending through the spatial region (14), electrically isolated from the elongated conductor (10), and preferably parallel therewith. In this other distinct version, the control arrangement (614) includes a switching arrangement, for, when in the conducting state, gating the predetermined current to the second electrical conductor, and for, when in the nonconducting state, preventing the predetermined test current from flowing in the second electrical conductor.

What is claimed is:

1. A current sensor arrangement for measuring a subject electrical current flow, said current sensor arrangement comprising:

an elongated conductor having fixed dimensions, and being configured for producing a generally planar magnetic field within a spatial region adjacent said conductor when said subject electrical current flows therethrough;

a magnetic field sensing device which produces a signal voltage in response to a magnetic field in a particular direction therethrough, the magnitude of which signal voltage is approximately linearly related to the magnitude of said magnetic field in its vicinity, at least over a limited range of magnetic fields, which magnetic field sensing device may be temperature-dependent or variable in its sensitivity from device to device, said magnetic field sensing device being located in said spatial region with said particular direction generally parallel to said planar magnetic field, whereby said magnetic field sensing device produces a magnetic-field-representative signal voltage in response to said magnetic field;

controllable test current generating means magnetically coupled to said spatial region, for, when energized, generating a predetermined current flow for generating a test magnetic field component in said spatial region, which test magnetic field component is generally parallel with, and in the same polarity as, said planar magnetic field, whereby said magnetic field sensing device produces a magnetic-field-representative signal voltage related to the magnitude of the sum of said subject electric current and said predetermined current;

control means coupled to said magnetic field sensing device and to said test current generating means, for recurrently energizing said controllable test current generating means, and for determining the magnitude of said current flow in said elongated conductor from at least (a) the magnitude of said magnetic-field-representative signal voltage during those times during which said controllable test current generating means is energized, (b) the magnitude of said magnetic-field-representative signal voltage during times in which said controllable test current generating means is not energized, and (c) the magnitude of said predetermined current.

2. A current sensor arrangement according to claim 1, wherein said magnetic field sensing device is one of a giant magnetoresistive device and spin-dependent tunneling device.

3. A current sensor arrangement according to claim 1, wherein:

said test current generating means is galvanically coupled to said elongated conductor adjacent said spatial region, for causing said test current to flow through said elongated conductor; and wherein said control means comprises switching means, for, when in the conducting state, gating said predetermined current to said elongated conductor, and for, when in the nonconducting state, preventing said predetermined current from flowing in said elongated conductor.

4. A current sensor arrangement according to claim 3, wherein said conducting means comprises current conductors connected to said elongated conductor on either side of said spatial region.

5. A current sensor arrangement for measuring a subject electrical current flow, said current sensor arrangement comprising:

an elongated conductor having fixed dimensions, and being configured for producing a generally planar magnetic field within a spatial region adjacent said conductor when said subject electrical current flows therethrough;

a magnetic field sensing device which produces a signal voltage in response to a magnetic field in a particular direction therethrough, the magnitude of which signal voltage is approximately linearly related to the magnitude of said magnetic field in its vicinity, at least over a limited range of magnetic fields, which magnetic field sensing device may be temperature-dependent or variable in its sensitivity from device to device, said magnetic field sensing device being located in said spatial region with said particular direction generally parallel to said planar magnetic field, whereby said magnetic field sensing device produces a magnetic-field-representative signal voltage in response to said magnetic field;

controllable test current generating means magnetically coupled to said spatial region, for, when energized, generating a predetermined current flow for generating a test magnetic field component in said spatial region, which test magnetic field component is generally parallel with said planar magnetic field, whereby said magnetic field sensing device produces a magnetic-field-representative signal voltage related to the magnitude of the sum of said subject electric current and said predetermined current;

control means coupled to said magnetic field sensing device and to said test current generating means, for recurrently energizing said controllable test current generating means, and for determining the magnitude of said current flow in said elongated conductor from at least (a) the magnitude of said magnetic-field-representative signal voltage during those times during which said controllable test current generating means is energized, (b) the magnitude of said magnetic-field-representative signal voltage during times in which said controllable test current generating means is not energized, and (c) the magnitude of said predetermined current, wherein:

said controllable test current generating means comprises a second electrical conductor extending through said spatial region, electrically isolated from said elongated conductor; and said control means comprises switching means, for, when in the conducting state, gating said predetermined current to said second electrical conductor, and for, when in the nonconducting state, preventing said predetermined current from flowing in said second electrical conductor.

\* \* \* \* \*